(12) United States Patent
Kim et al.

(10) Patent No.: US 6,996,305 B2
(45) Date of Patent: Feb. 7, 2006

(54) PRINTED CIRCUIT BOARD WITH OPTO-VIA HOLES AND PROCESS OF FORMING THE OPTO-VIA HOLES

(75) Inventors: Young-Woo Kim, Chungchungnam-do (KR); Young-Sang Cho, Chungchungnam-do (KR); Dek-Gin Yang, Chungchungbuk-do (KR); Kyu-Hyok Yim, Chungchungbuk-do (KR)

(73) Assignee: Samsung Electro-Mechanics Co., Ltd., (KR)

( * ) Notice: Subject to any disclaimer, the term of this patent is extended or adjusted under 35 U.S.C. 154(b) by 81 days.

(21) Appl. No.: 10/625,550

(22) Filed: Jul. 24, 2003

(65) Prior Publication Data

US 2004/0145873 A1    Jul. 29, 2004

(30) Foreign Application Priority Data

Dec. 18, 2002  (KR)  .................... 10-2002-0081236

(51) Int. Cl.
  G02B 6/26    (2006.01)
  G02B 6/42    (2006.01)
  G02B 6/12    (2006.01)
(52) U.S. Cl. .................. 385/15; 385/14; 385/31; 385/39; 385/49; 385/50; 438/29; 438/31
(58) Field of Classification Search ........... 385/14–15, 385/31, 49–51, 129–132, 33, 47; 438/29, 438/31; 29/829–831, 835–837, 846, 852; 174/262, 266; 427/97.1–97.2, 97.7; 216/19–20
See application file for complete search history.

(56) References Cited

U.S. PATENT DOCUMENTS

| | | | | |
|---|---|---|---|---|
| 4,526,835 A | * | 7/1985 | Takahashi et al. | 428/413 |
| 4,854,038 A | * | 8/1989 | Wiley | 29/830 |
| 5,129,142 A | * | 7/1992 | Bindra et al. | 29/852 |
| 5,191,174 A | * | 3/1993 | Chang et al. | 174/266 |
| 5,224,265 A | * | 7/1993 | Dux et al. | 29/852 |
| 5,232,548 A | * | 8/1993 | Ehrenberg et al. | 216/18 |
| 5,386,627 A | * | 2/1995 | Booth et al. | 29/852 |
| 5,421,083 A | * | 6/1995 | Suppelsa et al. | 29/852 |
| 5,502,893 A | * | 4/1996 | Endoh et al. | 29/852 |
| 5,568,682 A | * | 10/1996 | Gates et al. | 29/831 |
| 5,707,893 A | * | 1/1998 | Bhatt et al. | 216/18 |
| 6,005,766 A | * | 12/1999 | Muraki | 361/679 |

(Continued)

*Primary Examiner*—Frank G. Font
*Assistant Examiner*—Ryan Lepisto
(74) *Attorney, Agent, or Firm*—Morgan Lewis & Bockius LLP

(57) ABSTRACT

Disclosed is a printed circuit board with opto-via holes for transmitting an optical signal to an optical waveguide in the PCB, and a process of forming the opto-via holes. The process comprises forming a plurality of via holes on a plurality of copper clad laminates using a drill, plating an inner wall of each via hole, exposing and etching the plated portions of an upper and lower side of each copper clad laminate to form a circuit pattern on the upper and lower side of the copper clad laminate, layering the patterned copper clad laminates on each other using an insulating resin adhesive, and removing the insulating resin adhesive in the predetermined via holes to form opto-via holes. Therefore, the process is advantageous in that the optical signal is stably transmitted to the optical waveguide in the PCB without damage to the optical waveguide directly exposed to an external environment, and the optical waveguide suitable to physical properties of the material constituting the PCB is easily inserted between the inner layer and the outer layer.

15 Claims, 13 Drawing Sheets

U.S. PATENT DOCUMENTS

| | | | |
|---|---|---|---|
| 6,098,282 A * | 8/2000 | Frankeny et al. | 29/852 |
| 6,195,883 B1 * | 3/2001 | Bhatt et al. | 29/852 |
| 6,438,281 B1 * | 8/2002 | Tsukamoto et al. | 385/14 |
| 6,499,214 B2 * | 12/2002 | Li et al. | 29/831 |
| 6,730,859 B2 * | 5/2004 | Muramatsu et al. | 174/262 |
| 6,787,710 B2 * | 9/2004 | Uematsu et al. | 174/261 |
| 6,826,830 B2 * | 12/2004 | Egitto et al. | 29/852 |
| 6,832,436 B2 * | 12/2004 | Anstrom et al. | 29/852 |
| 2001/0010250 A1 * | 8/2001 | Kobayashi et al. | 156/261 |
| 2002/0195716 A1 * | 12/2002 | Magnuson et al. | 257/774 |
| 2003/0128907 A1 * | 7/2003 | Kikuchi et al. | 385/14 |
| 2003/0129383 A1 * | 7/2003 | Yamamoto et al. | 428/317.7 |
| 2003/0169038 A1 * | 9/2003 | Kang et al. | 324/253 |
| 2004/0212030 A1 * | 10/2004 | Asai | 257/432 |
| 2004/0238209 A1 * | 12/2004 | Yuri et al. | 174/257 |

* cited by examiner

PRINTED CIRCUIT BOARD WITH OPTO-VIA HOLES AND PROCESS OF FORMING THE OPTO-VIA HOLES

BACKGROUND OF THE INVENTION

1. Field of the Invention

The present invention pertains, in general, to a printed circuit board with opto-via holes and a process of forming the opto-via holes and, in particular, to a printed circuit board with opto-via holes for transmitting an optical signal to an optical waveguide in the printed circuit board, and a process of forming the opto-via holes.

2. Description of the Prior Art

As well known to those skilled in the art, a printed circuit board (PCB) functions to connect various electronic components to each other on a board along a predetermined pattern, and is applied to various electronic goods such as home appliances including a digital TV and advanced telecommunication equipments.

A conventional PCB comprises a copper plate on which a circuit pattern is formed, and an inner and an outer layer. However, recently, an electro-optical circuit board (EOCB) is frequently used instead of the conventional PCB. At this time, the EOCB is formed by inserting an optical waveguide comprising polymer and glass fiber, for transmitting and receiving an optical signal and into the PCB.

In other words, the EOCB is the PCB into which the optical waveguide and a glass plate are inserted after a circuit pattern is already formed on the PCB, and it transmits and receives both an electrical signal and an optical signal. Additionally, the EOCB functions to convert the optical signal into the electrical signal so as to store data or process signals in a component mounted on the PCB, and a very high speed data telecommunication is realized when the electrical signal is interfaced into the optical signal in the PCB.

Meanwhile, an opto-via hole acts as a medium for connecting the optical signal to an entrance of the optical waveguide component of an inner layer of the PCB, and is a kind of via hole of the PCB functioning to transmit signals in the PCB to a photodiode (PD) or vertical-cavity surface-emitting laser (hereinafter referred to as "VCSEL") acting as a light source component located outside the PCB. When the optical waveguide is formed, there is a need to form the opto-via hole which acts as a channel for connecting the outer layer of the PCB to the inner layer of the PCB and easily transmits the optical signal from the inner layer to the outer layer.

In detail, in accordance with the recent trend of rapid increase in the use of the Internet and improvements of service quality on the internet, an amount of data to be processed and transmitted is rapidly increased, so it is necessary to expand a bandwidth and rapidly to process signals. Accordingly, it is required to use the EOCB as the medium of optical interfacing. That is to say, the electrical signal used in the conventional PCB is undesirably affected by electromagnetic susceptibility (EMS) characteristics during a high-speed switching process at a GHz band, so there remains a need to adopt optical interfacing which is not limited by the EMS characteristics.

A detailed description of the optical interfacing in the PCB will be given, below.

FIG. 1 schematically illustrates a beam coupling in the case of using a beam reflecting micro mirror in a conventional manner.

With reference to FIG. 1, an electrical signal transmitted from a processor board 2 is converted into an optical signal by a laser diode 1 in a transmitting module 3, transported via left lenses 8a, 8b, and then reflected by a left micro mirror 4a inserted into the PCB. The reflected signal is transported through the optical waveguide, reflected by a right reflecting mirror 4b, and then transported through right lenses 8c, 8d to a photo diode 6 in a receiving module 7. At this time, the optical waveguide is embedded within a low loss multimode polymer waveguide core 5a, 5b, and a waveguide clad 9 is formed on an upper and a lower part of the core. Therefore, the electrical signal transmitted from the left processor board 2 is converted into the optical signal and transported to a photo diode 6, and the optical signal is then converted into the electrical signal by the photo diode 6 and transported to a right processor board.

However, there is no commercial process by which the waveguide or glass plate is inserted into the PCB and connected to components outside the PCB, even though it has been ten years or more since the EOCB was first proposed. Additionally, a process of fabricating the PCB depends on a method of applying the optical signal to the PCB. Accordingly, it is necessary to desirably determine the procedure of forming the via hole so that the via hole is less affected by chemicals used to fabricate the PCB.

Furthermore, a conventional process of forming the PCB with opto-via holes is disadvantageous in that the optical waveguide component and the glass fiber are undesirably affected by physical and chemical stresses during a fabrication process of the PCB, thereby readily degrading the light transmissivity of the PCB, so there is a problem in forming the desired opto-via hole in accordance with different processes.

SUMMARY OF THE INVENTION

Therefore, the present invention has been made keeping in mind the above disadvantages occurring in the conventional arts, and an object of the present invention is to provide a PCB with opto-via holes, each of which allows a signal to stably pass therethrough while minimizing damage to an optical waveguide directly exposed to an outside of the PCB, and into which the optical waveguide is inserted, and a process of forming the opto-via holes.

The above object can be accomplished by providing a process of forming an opto-via hole, comprising forming a plurality of via holes on a plurality of copper clad laminates using a drill, plating an inner wall of each via hole, exposing and etching plated portions of an upper and lower side of each copper clad laminate to form a circuit pattern on the upper and lower side of the copper clad laminate, layering a plurality of patterned copper clad laminates each other using an insulating resin adhesive, and removing the insulating resin adhesive in the predetermined via holes to form opto-via holes.

At this time, the opto-via holes comprise electric-via holes and opto-via holes.

Additionally, it is preferable that the opto-via holes are formed by a $CO_2$ laser beam or a mechanical bit in the removing step, and an epoxy resin with 95% more light transmissivity is filled in the opto-via holes.

Further, the present invention provides a process of forming an opto-via hole for an optical waveguide, comprising forming circuit patterns on a plurality of copper clad laminates, respectively. Each of the copper clad laminates includes an insulating layer and copper-clad layers coated on an upper and a lower side of the insulating layer. The process also includes firstly layering the patterned copper clad laminates each other using an adhesive, firstly drilling a plurality of electric- and opto-via holes on desired positions of the patterned copper clad laminate, plating inner walls of the firstly drilled electric- and opto-via holes, exposing and etching plated portions of an upper and a lower side of each copper clad laminate to form a circuit pattern on the upper and lower side of the copper clad laminate, and secondly drilling a plurality of second opto-via holes on the copper clad laminate.

The process further comprises forming a stepped part in the vicinity of the opto-via hole and attaching the optical waveguide to the stepped part.

In addition, it is preferable that an epoxy resin with 95% more light transmissivity is filled in the opto-via holes.

Furthermore, the present invention provides a printed circuit board with an opto-via hole for an optical waveguide, comprising a plurality of copper clad laminates with a plurality of via holes formed by a drill, and a plated layer formed on an inner wall of each via hole. A circuit pattern layer is formed by exposing and etching plated portions on an upper and a lower side of each copper clad laminate, and an insulating resin adhesive is used to layer a plurality of patterned copper clad laminates on each other. Additionally, the printed circuit board in the present invention also includes a plurality of opto-via holes formed by removing the insulating resin adhesive in the via holes, and an optical waveguide for transmitting an optical signal through each opto-via hole.

The opto-via holes comprise electric-via holes and opto-via holes.

The opto-via holes are formed by a $CO_2$ laser beam or a mechanical bit.

Further, an epoxy resin with 95% or more light transmissivity is filled in the opto-via holes.

Moreover, the present invention provides a printed circuit board with an opto-via hole for an optical waveguide, comprising a plurality of copper clad laminates with an insulating layer and copper layers coated on an upper and a lower side of the insulating layer. Each of the copper clad laminates includes a circuit pattern formed thereon. The patterned copper clad laminates are firstly layered on each other using an adhesive. The printed circuit board in the present invention also includes a plurality of electric-via holes formed by firstly drilling desired points on the copper clad laminates, and a plurality of first opto-via holes formed at the same time as the electric-via holes. A plated layer is formed on an inner wall of each electric-via hole and first opto-via hole, and a circuit pattern layer is formed by exposing and etching plated portions on an upper and a lower side of each copper clad laminate. Additionally, a plurality of second opto-via holes are formed by secondly drilling desired points on the copper clad laminates, and an optical waveguide transmits an optical signal through the first and second opto-via holes.

At this time, an epoxy resin with 95% or more light transmissivity is filled in the second opto-via holes.

Therefore, the present invention is advantageous in that the electric- and opto-via holes are all formed on the PCB for the optical waveguide, thereby stably transmitting a signal from an outer layer of the PCB to an inner layer of the PCB without damage to the optical waveguide directly exposed to an external environment.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
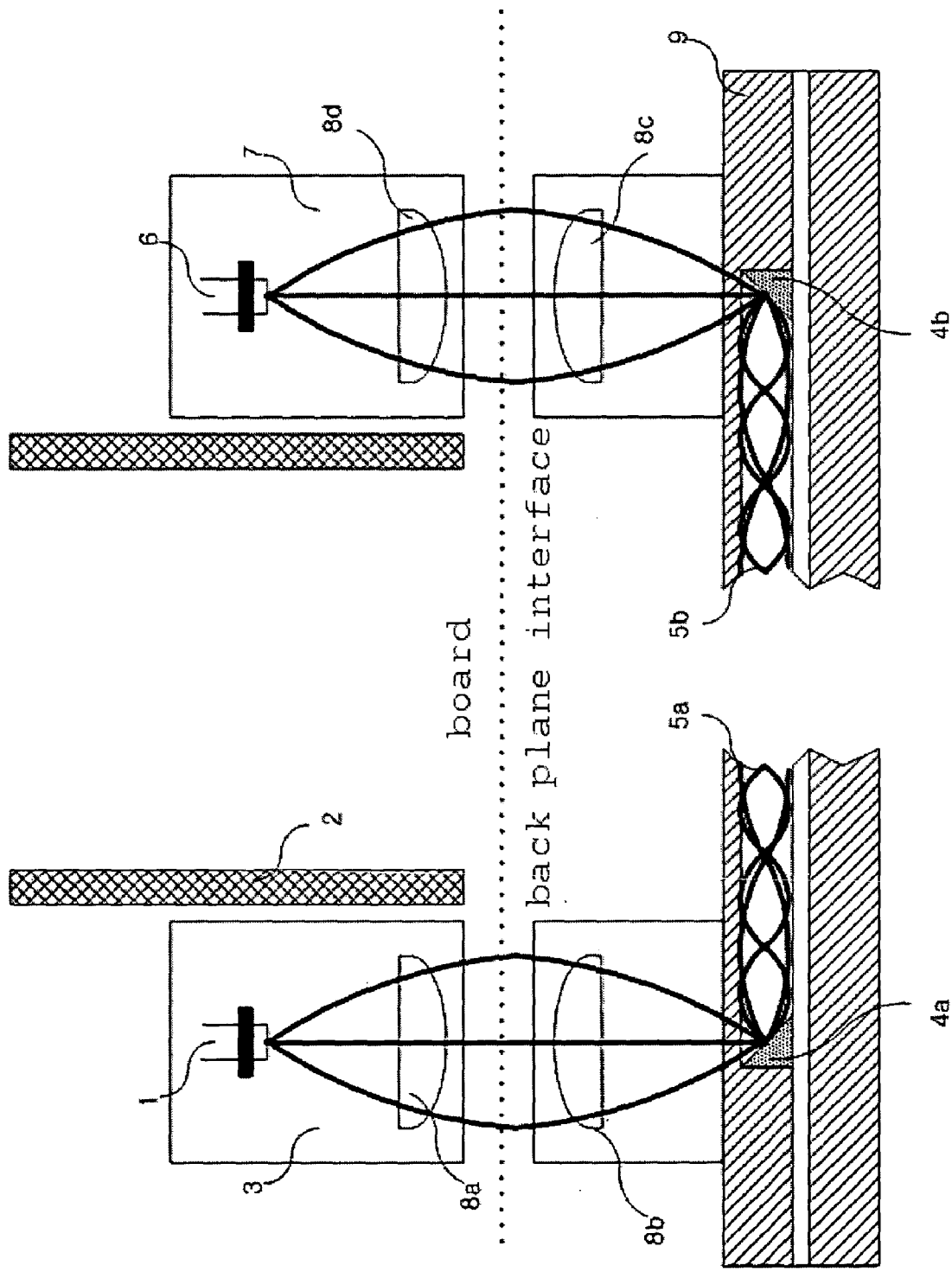
FIG. 1 schematically illustrates a beam coupling in the case of using a beam reflecting micro mirror according to a conventional art.

Reference numerals are made to the drawings, in which the same reference numerals are used throughout the different drawings to designate the same or similar components.

First Process: A Process of Forming Opto-via Holes in an Outer Layer

FIGS. 2a to 2f are sectional views stepwisely illustrating the formation process of the opto-via holes in the outer layer of a PCB according to an embodiment of the present invention.

Figure 2A:
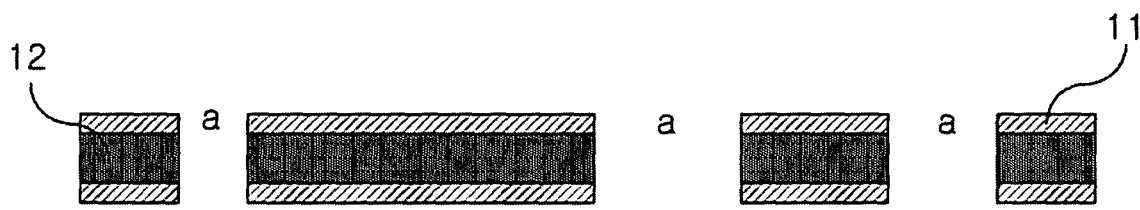
FIGS. 2a to 2f are sectional views stepwisely illustrating the formation process of opto-via holes in an outer layer of a PCB according to an embodiment of the present invention.
Figure 2B:
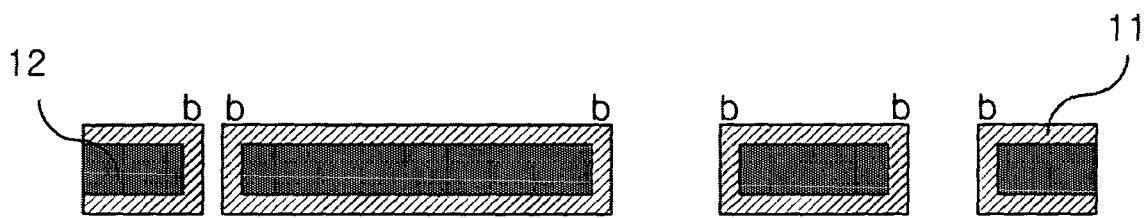
Figure 2C:
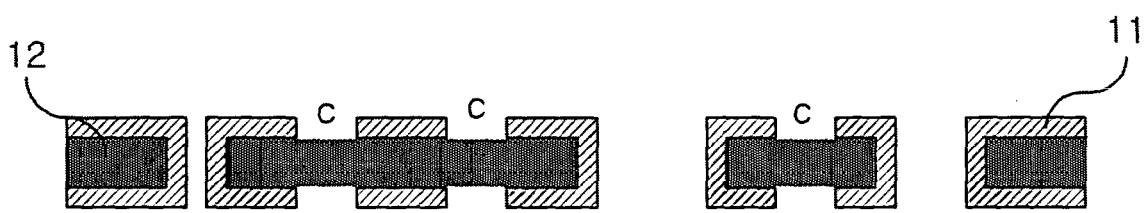
Figure 2D:
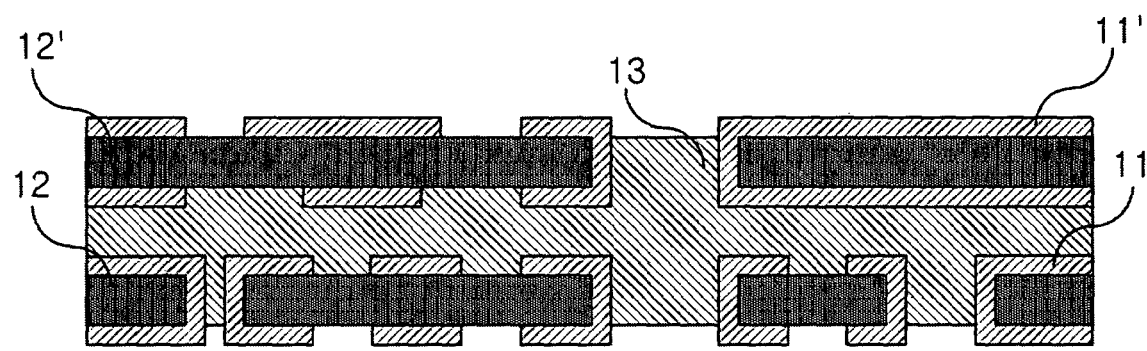

In detail, FIG. 2a illustrates a forming step of a plurality of via holes on a copper clad laminate (CCL) using a drill, FIG. 2b illustrates a plating step of an inner wall of each via hole, and FIG. 2c illustrates a patterning step of a plated portion on the copper clad laminate by an exposing and an etching process. Additionally, FIG. 2d illustrates a layering step of the patterned copper clad laminates using an insulating resin adhesive, and in FIG. 2e, the adhesive on a position on which the opto-via holes are to be formed is removed, thereby forming the opto-via holes in the copper clad laminate.

With reference to FIGS. 2a to 2e, the via holes are formed on the copper clad laminate (CCL) using a drill, in which a copper layer is coated on an upper and a lower side of an insulating panel 12 made of epoxy and a glass fiber (FIG. 2a). The via holes (a) thus formed act as electric-via holes or the opto-via holes. Additionally, the drill may be a mechanical drill. At this time, the electric-via hole has the same diameter as a via-hole of a conventional PCB, and the opto-via hole has larger diameter than the electric-via hole so as to interface light to the optical waveguide.

The via hole is then subjected to an electroless or electrolytic Cu plating (FIG. 2b), thereby plating an inner wall of the via hole (b) by a conventional plating process.

The plated copper clad laminate is then patterned by an exposing and etching process (FIG. 2c) to form a circuit pattern (c) on the plated copper clad laminate, and a detailed description of a process of forming the circuit pattern will be omitted in this specification because the present invention relates to a process of forming the opto-via holes on the circuit pattern.

Referring to FIG. 2d, the copper clad laminates on which the circuit patterns are formed are layered on each other using an insulating resin adhesive, for example, prepreg. At this time, a reference numeral 13 denotes an adhesive, and one CCL is layered on the other CCL. Each CCL comprises a panel or an epoxy insulating layer 12, 12' which is coated with the copper layer 11, 11' at an upper and a lower side thereof and subjected to a drilling, a plating, and a patterning process. A process of FIGS. 2a to 2d is conducted in a manner similar to a conventional process of forming the via hole.

Figure 2E:
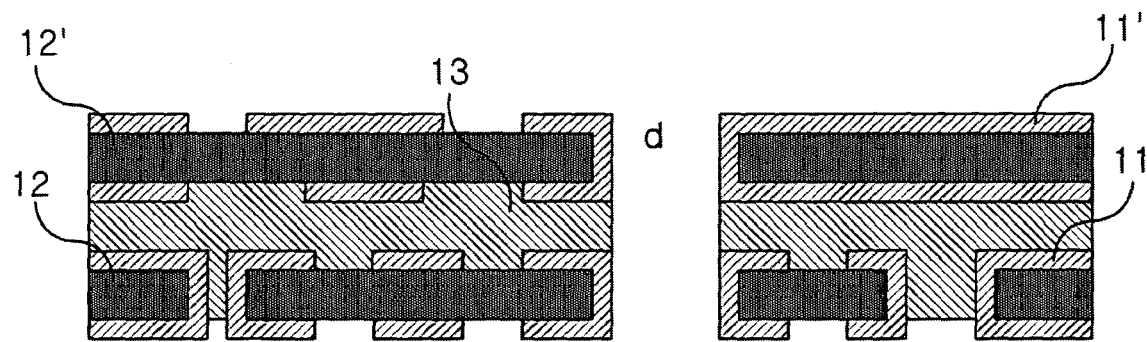

The resulting structure is then processed by a $CO_2$ laser or a mechanical bit to form the opto-via holes (d) (FIG. 2e). In other words, the insulating resin adhesive is removed from the resulting structure and the opto-via holes are formed. Additionally, a stepped part 15 may be formed in the vicinity of the opto-via holes (FIG. 2f), and the optical waveguide 14 is attached to the stepped part 15.

Therefore, the PCB fabricated according to the process of FIGS. 2a to 2f is used as an outer layer of a multi-layered PCB for the optical waveguide.

Second Process: A Process of Forming Opto-via Holes in an Inner Layer

FIGS. 3a to 3f are sectional views stepwisely illustrating the formation process of opto-via holes in an inner layer of a PCB according to another embodiment of the present invention.

Figure 3A:
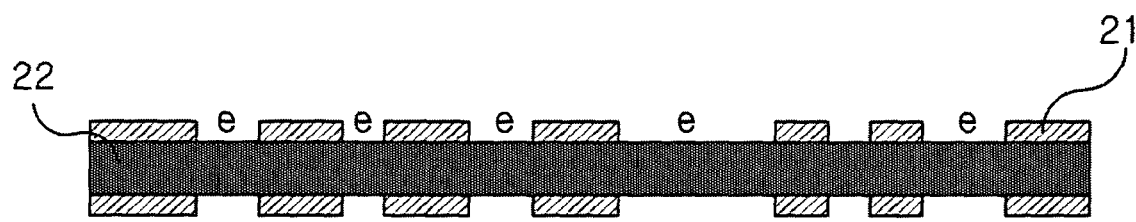
FIGS. 3a to 3f are sectional views stepwisely illustrating the formation process of opto-via holes in an inner layer of a PCB according to the present invention.

With reference to FIGS. 3a to 3f, an insulating panel 22 made of epoxy and the glass fiber is coated with a copper layer 21 at an upper and a lower side thereof to produce a CCL, and a circuit pattern (e) is formed on the CCL (FIG. 3a).

Figure 3B:
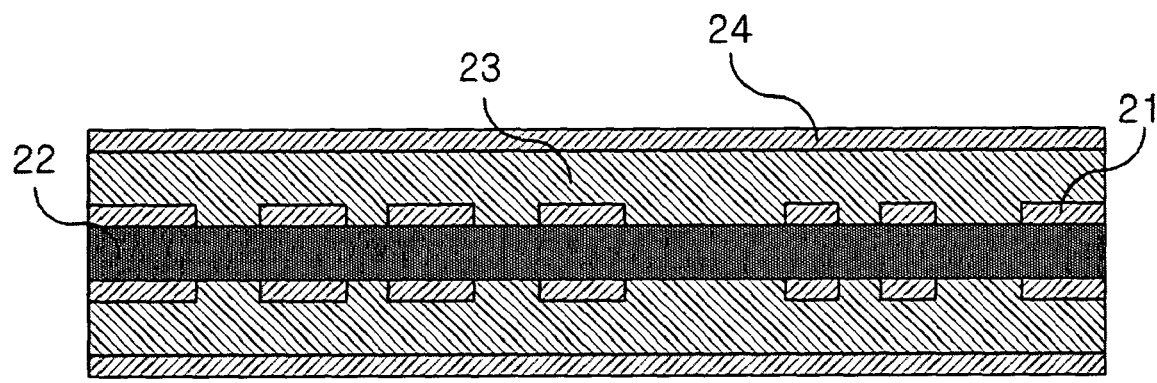

The copper layer 24 is then covered on an upper and a lower side of a circuit pattern layer of FIG. 3a (FIG. 3b). At this time, a reference numeral 23 denotes an adhesive for attaching layers to each other.

Figure 3C:
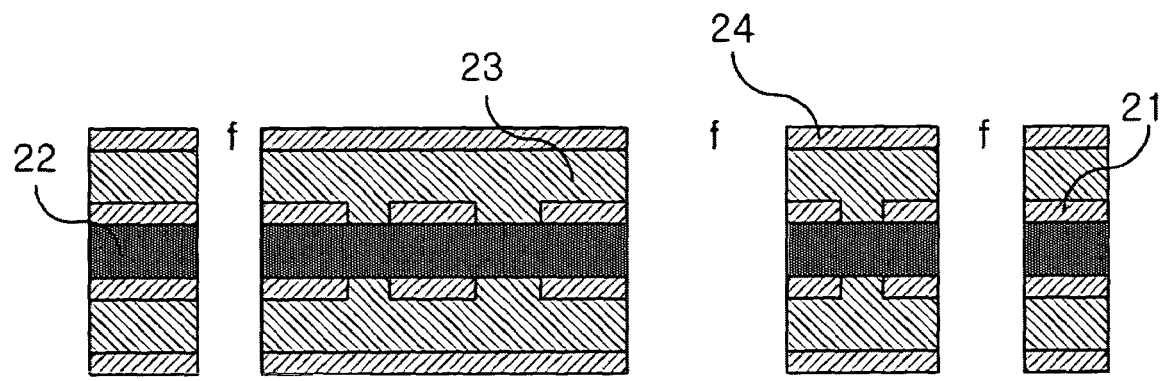
Figure 3D:
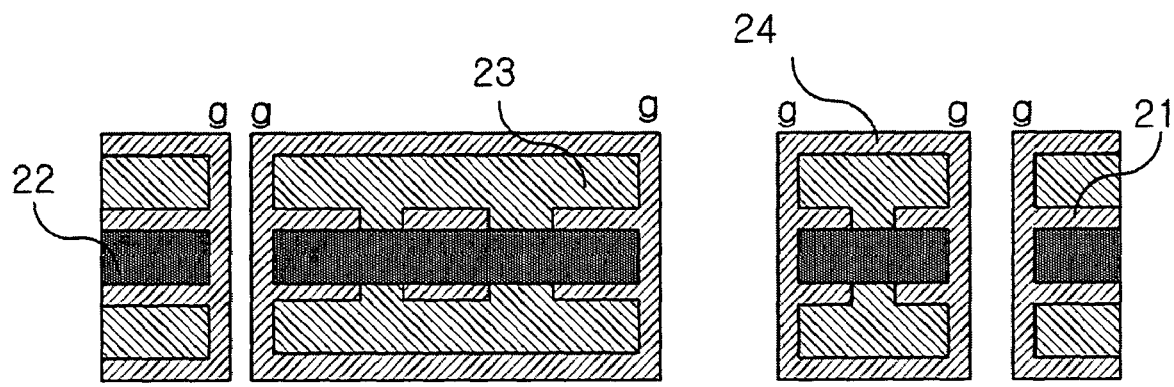

Referring to FIG. 3c, the resulting structure is subjected to a first drilling process to simultaneously form electric- and opto-via holes (f) using a drill. At this time, the drill may be a mechanical drill.

The drilled structure is then plated in an electrolytic or electroless manner (FIG. 3d) to form a plated layer (g).

Figure 3E:
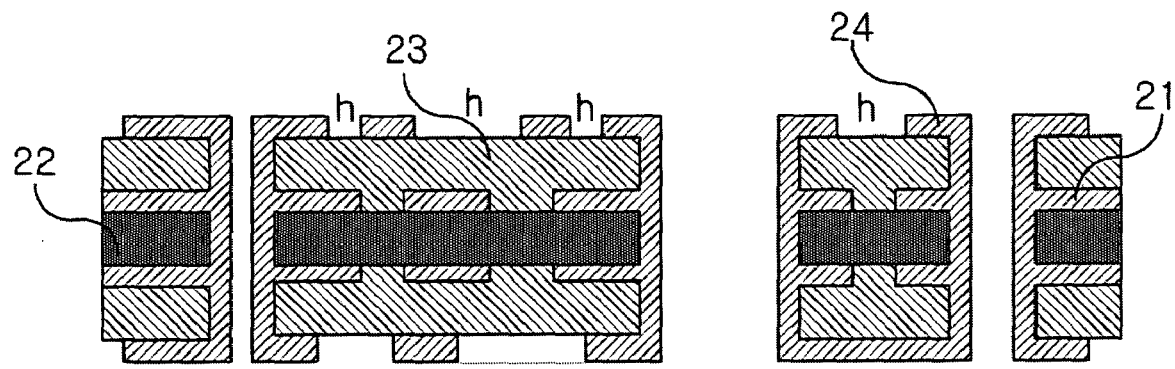

A predetermined circuit pattern (h) is then formed on an outer layer of the plated structure (FIG. 3e).

Figure 3F:
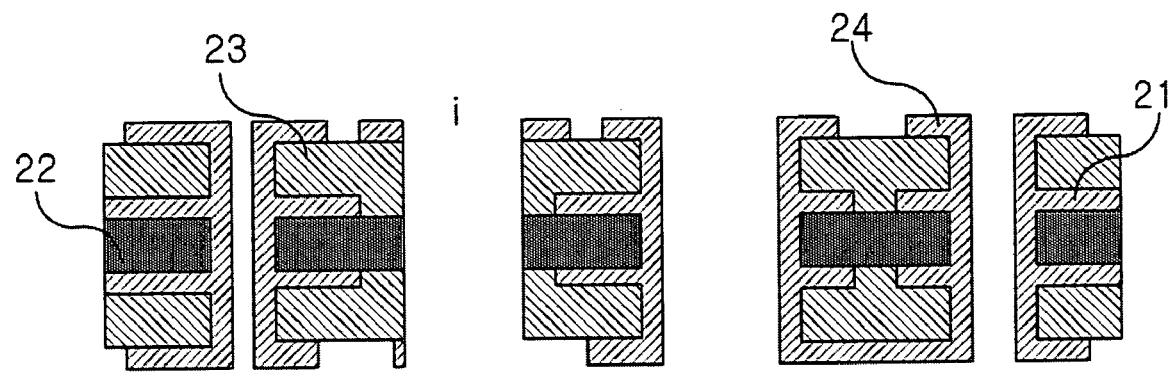

The patterned structure is secondly drilled to form the opto-via hole (i) (FIG. 3f). In other words, the opto-via holes are formed in the CCL by the first and second drilling processes.

In the case of the first embodiment as shown in FIGS. 2a to 2e, the opto-via holes are formed in the inner layer of the PCB by removing an adhesive, but in the case of the second embodiment, the opto-via holes are formed by a separate second drilling process, as shown in FIG. 3f.

Therefore, the PCB fabricated by the process of FIGS. 3a to 3f is useful as the inner layer of the multi-layered PCB for the optical waveguide.

Third Process: A Process of Attaching the Outer Layer to the Inner Layer

FIGS. 4a to 4g are sectional views stepwisely illustrating the fabrication process of a PCB after opto-via holes are formed according to the present invention.

Figure 2F:
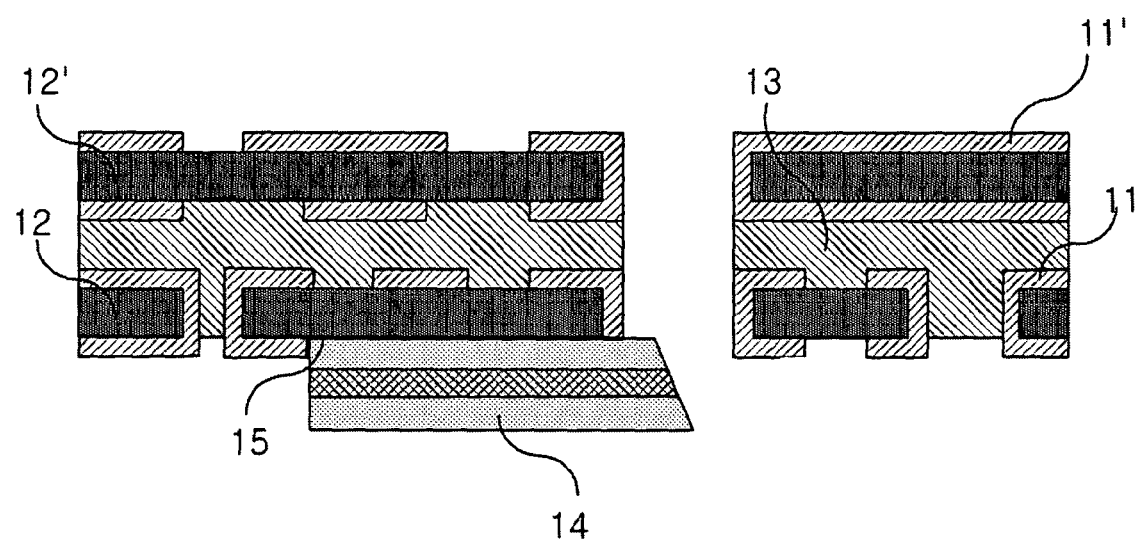
Figure 4A:
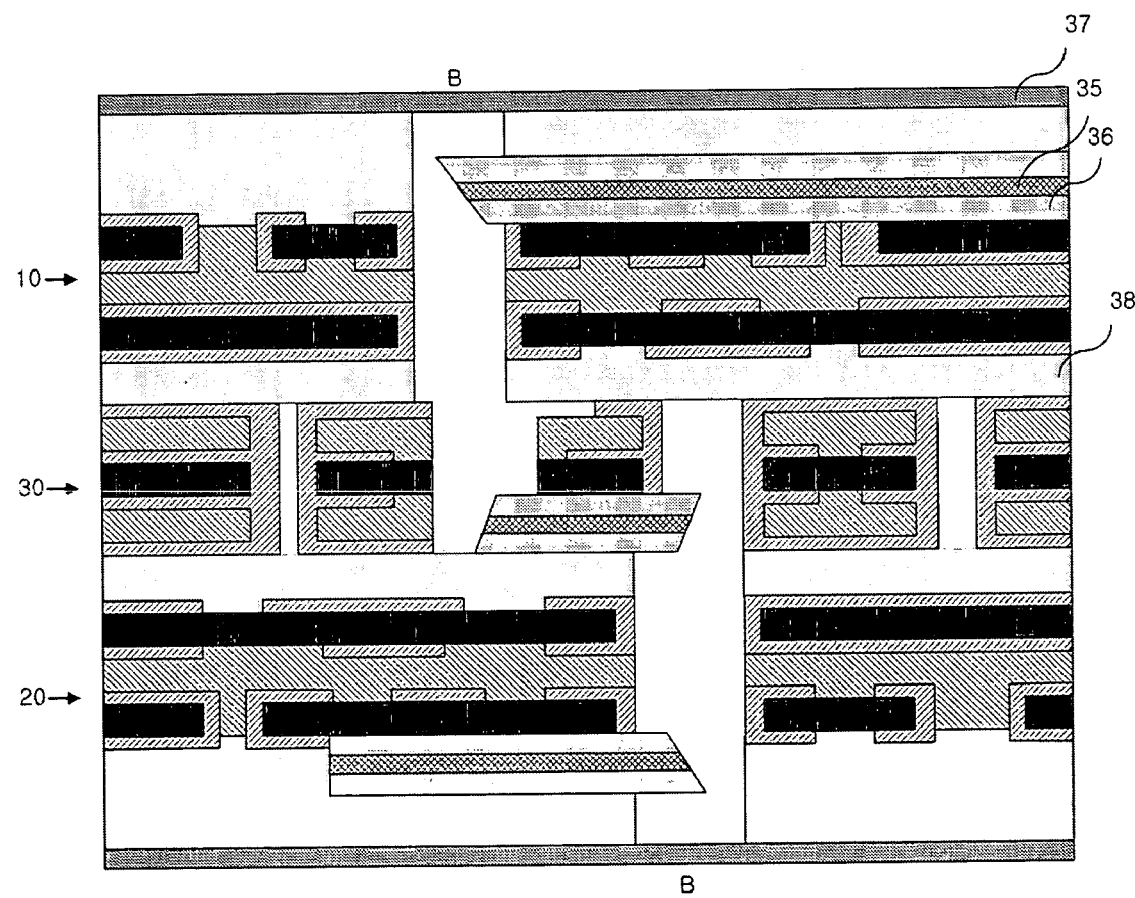
FIGS. 4a to 4g are sectional views stepwisely illustrating the fabrication process of the PCB after the opto-via holes are formed according to the present invention.

Each of the layers 10, 20, 30 with an optical waveguide 35, 36 is layered on each other with the use of an insulating resin adhesive 38 (FIG. 4a). At this time, the optical waveguide 35, 36 is attached to a predetermined position of an outer layer in which the opto-via holes are formed (FIG. 2f). The outer layers 10, 20 according to the first embodiment are layered on an upper and a lower side of the inner layer 30 according to the second embodiment, thereby forming the PCB with the optical waveguide. The inner layer 30 may have various shapes according to the intended use of the PCB, and plural inner layers may be inserted between the outer layers 10, 20. At this time, the number of inner and outer layers are prepared to correspond to the number of layers of the multi-layered PCB, and the electric- and opto-via holes are previously formed on the inner and outer layers, as in the first and second embodiments.

Figure 4B:
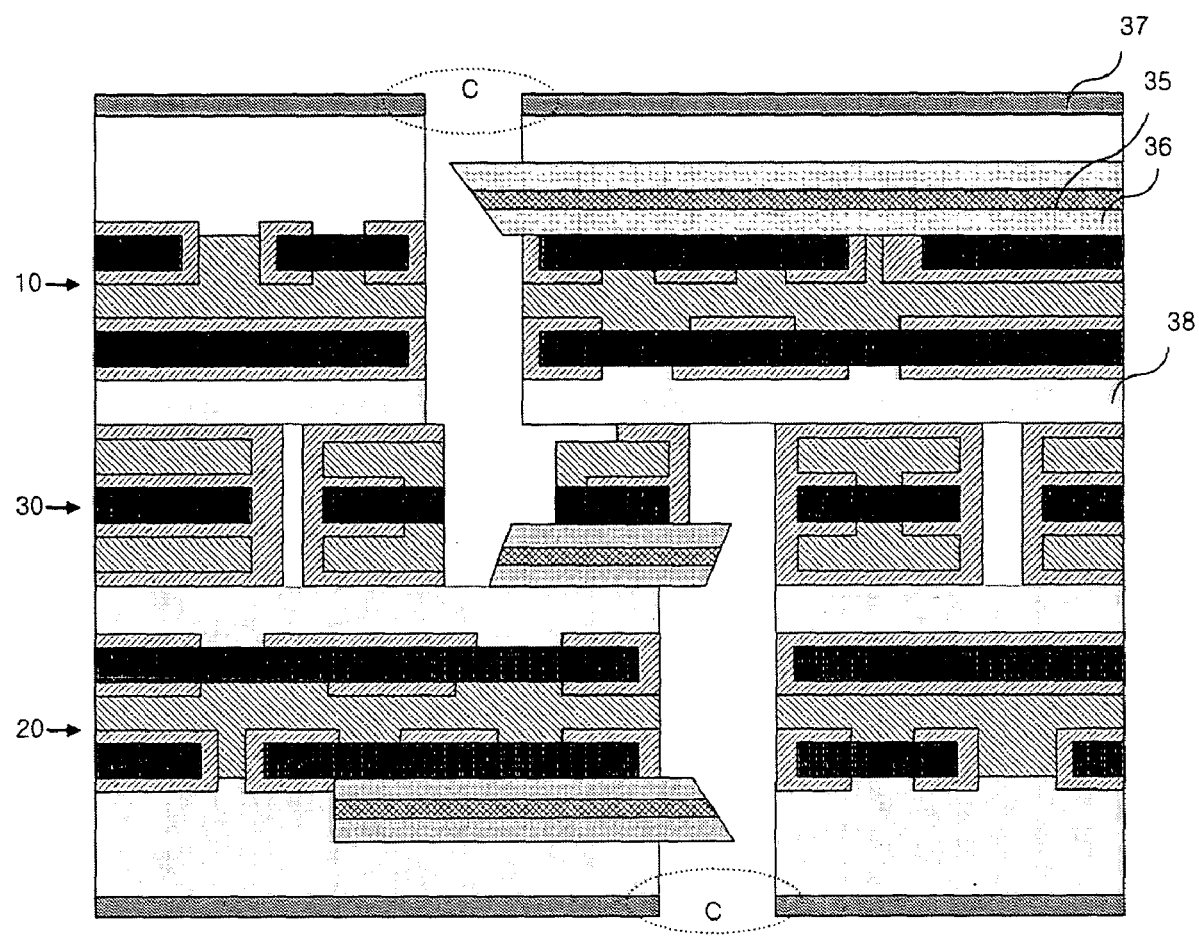

Referring to FIG. 4b, a part B of FIG. 4a, that is, the copper-clad part 37 is exposed and etched. In detail, after the outer layers 10, 20 are firstly layered on a CCL, the inner layer 30 is secondly layered on the resulting structure. The copper-clad part 37 is then removed to form an entrance for an optical-interfacing.

Figure 4C:
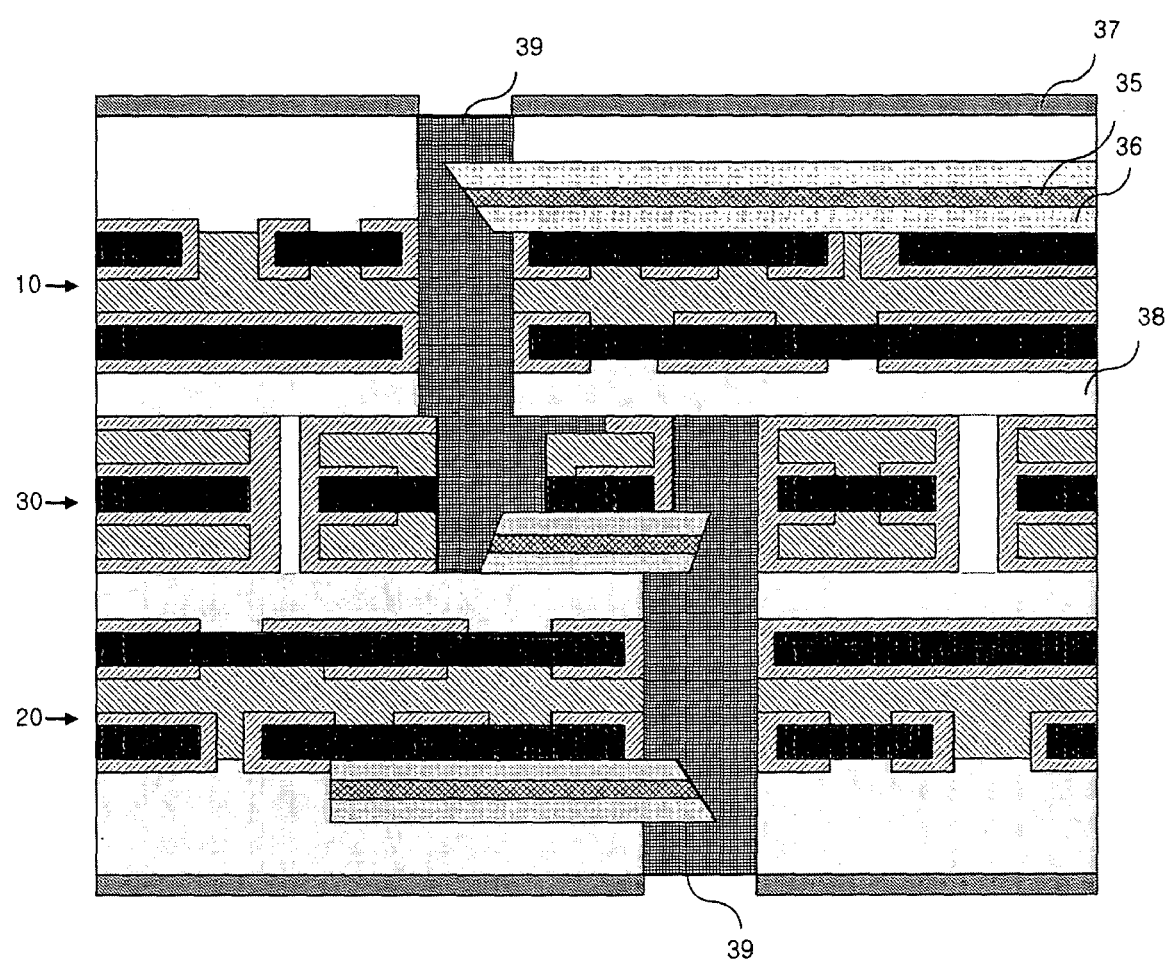

In FIG. 4c, a highly pure epoxy resin packing material 39 is filled into the entrance, i.e. a part C of the FIG. 4b in which the copper-clad part is removed. At this time, it is preferable that the epoxy resin packing material 39 has 95% or more light transmissivity so as to easily transmit light therethrough. If the packing material 39 is not filled into the entrance C, the entrance is easily deformed by an external impact.

Figure 4D:
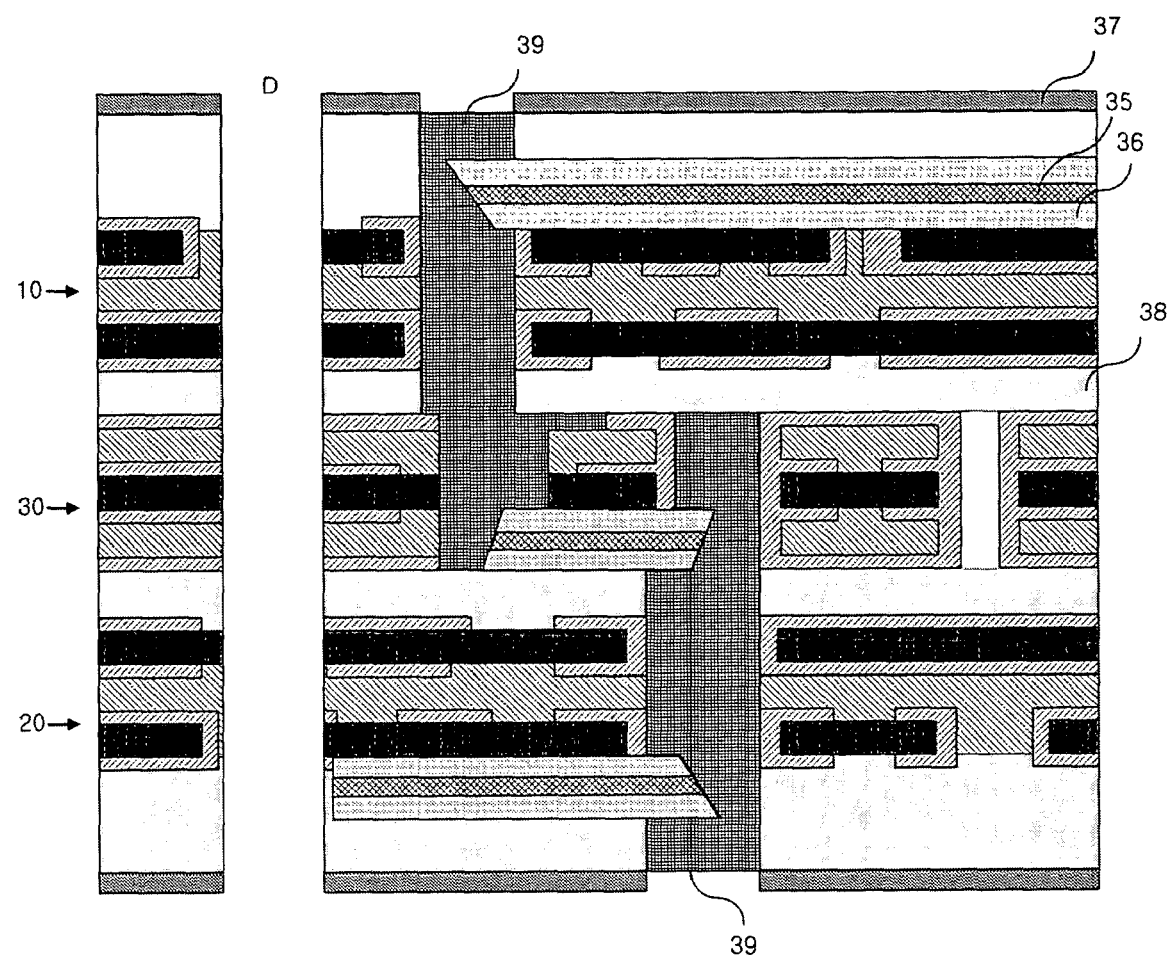
Figure 4E:
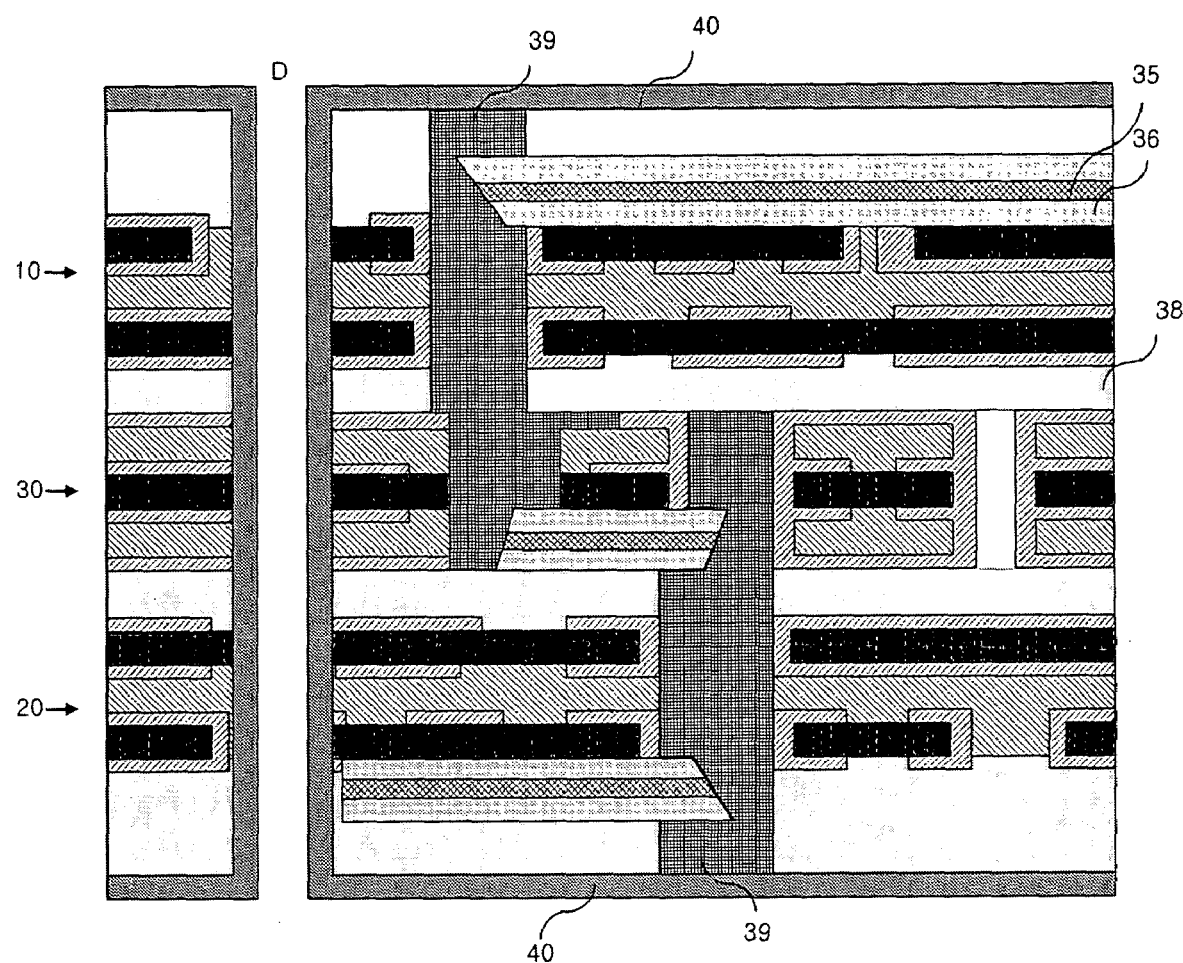

Turning now to FIG. 4d, a drilling process is conducted, thereby forming via holes D in the multi-layered PCB. Each via hole is electroless- or electrolytic-plated on its inner wall, as shown in FIG. 4e. Reference numeral 40 denotes a plated layer.

Figure 4F:
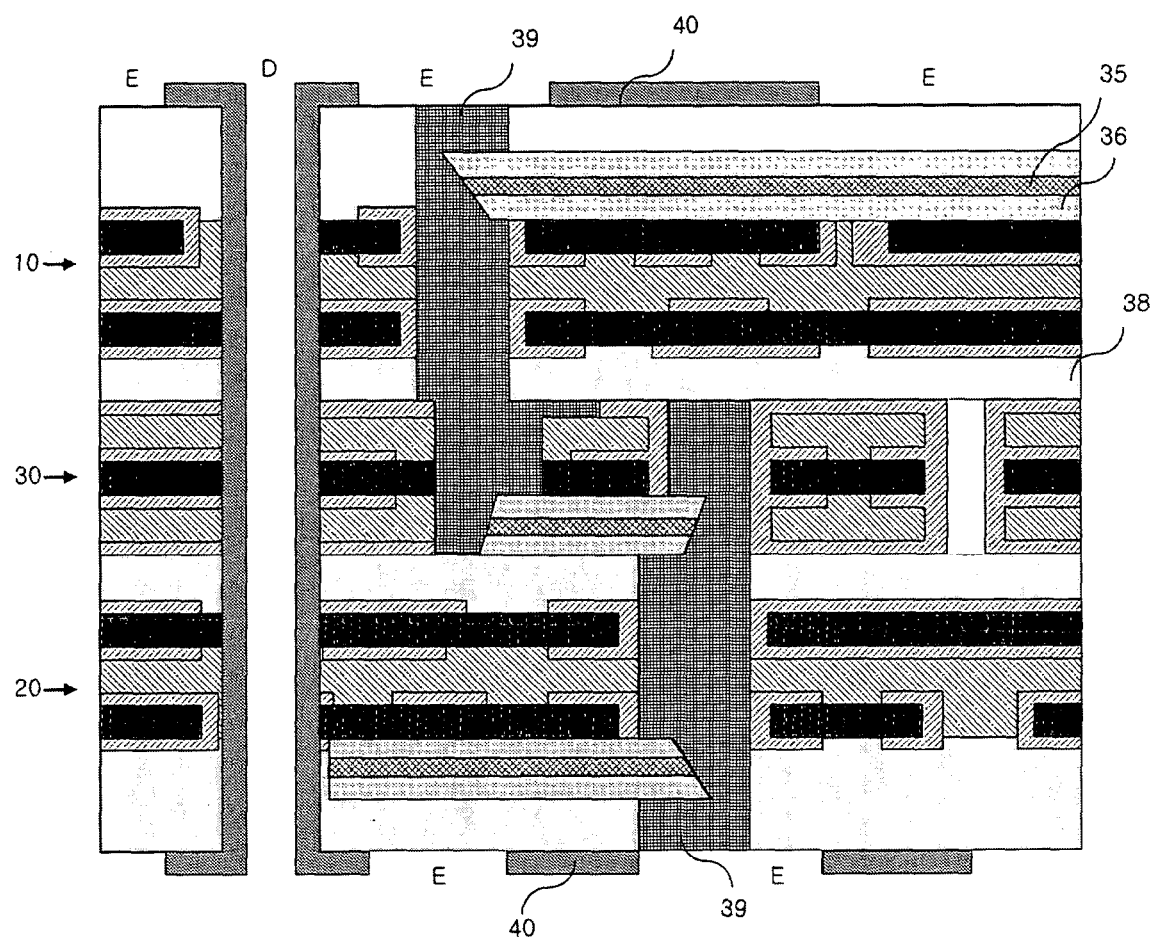

In FIG. 4f, a circuit pattern E is formed on the multi-layered PCB.

Figure 4G:
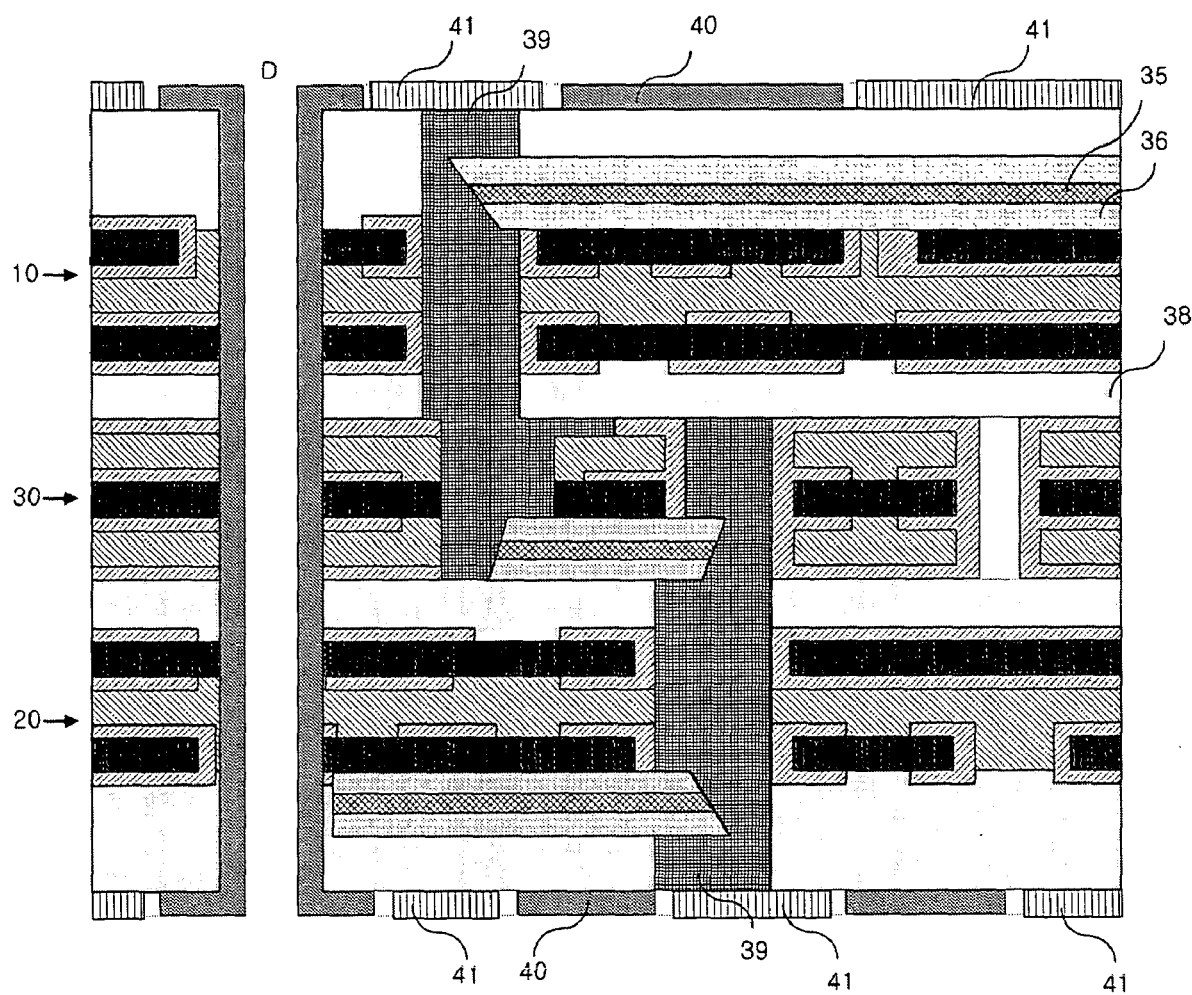

The patterned multi-layered PCB is subjected to a solder resist 41 and gold plating step (FIG. 4g). The solder resist 41 is coated on the patterned multi-layered PCB so as to protect the insulated positions of the outer layer from an external impact or a surface treatment, and the gold plating step is conducted in order to improve solderability of a position on which electronic parts are to be mounted (PAD).

Therefore, a process of forming opto-via holes according to the present invention is advantageous in that an optical signal is stably transmitted from an outer layer of a PCB to an inner layer of the PCB without damage to an optical waveguide directly exposed to an external environment, because the inner layer is attached to the outer layer after the opto-via holes are previously formed in the inner and outer layers of the PCB.

Another advantage of the present invention is that the optical waveguide suitable to physical properties of the material constituting the PCB is easily inserted between the inner layer and the outer layer.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A process of forming opto-via holes, comprising:
   forming a plurality of via holes in a plurality of copper clad laminates using a drill;
   plating an inner wall of each of the via holes;
   exposing and etching plated portions of an upper side and a lower side of each copper clad laminate to form a circuit pattern on the upper and lower sides of the copper clad laminate;
   layering the patterned copper clad laminates on each other using an insulating resin adhesive, the insulating resin filling a space between the copper clad laminates and a portion of the via holes;
   removing the insulating resin adhesive from the via holes; and
   forming an optical waveguide in the vicinity of the via holes to form the opto-via holes.

2. The process as set forth in claim 1, wherein the opto-via holes are formed by a $CO_2$ laser beam or a mechanical bit in the removing step.

3. A process of forming opto-via holes, comprising:
forming a plurality of via holes in a plurality of copper clad laminates using a drill;
plating an inner wall of each of the via holes;
exposing and etching plated portions of an upper side and a lower side of each copper clad laminate to form a circuit pattern on the upper and lower sides of the copper clad laminate;
layering the patterned copper clad laminates on each other using an insulating resin adhesive, the insulating resin filling a space between the copper clad laminates and a portion of the via holes; and
removing the insulating resin adhesive from the via holes to form opto-via holes, wherein the opto-via holes comprise electric-via holes and opto-via holes.

4. A process of forming opto-via holes, comprising:
forming a plurality of via holes in a plurality of copper clad laminates using a drill;
plating an inner wall of each of the via holes;
exposing and etching plated portions of an upper side and a lower side of each copper clad laminate to form a circuit pattern on the upper and lower sides of the copper clad laminate;
layering the patterned copper clad laminates on each other using an insulating resin adhesive, the insulating resin filling a space between the copper clad laminates and a portion of the via holes; and
removing the insulating resin adhesive from the via holes to form opto-via holes, wherein an epoxy resin with 95% or more light transmissivity is filled in the opto-via holes.

5. A process of forming opto-via holes for optical waveguides, comprising:
forming a first circuit pattern on a first copper clad laminate, said first copper clad laminate including an insulating layer and copper-clad layers coated on an upper side and a lower side of the insulating layer;
layering copper layers on the first patterned copper clad laminate using an adhesive;
drilling a plurality of electric- and first opto-via holes in the first layered copper clad laminate;
plating inner walls of the drilled electric- and first opto-via holes;
exposing and etching plated portions of an upper side and a lower side of the first layered copper clad laminate to form a second circuit pattern on the upper and lower sides of the first layered copper clad laminate; and
drilling a plurality of second opto-via holes in the first layered copper clad laminate after the second circuit pattern is formed on the upper and lower sides of the first layered copper clad laminate.

6. The process as set forth in claim 5, further comprising forming a stepped part in the vicinity of each of the first and second opto-via holes and attaching an optical waveguide to the stepped part.

7. The process as set forth in claim 5, wherein an epoxy resin with 95% or more light transmissivity is filled in the first and second opto-via holes.

8. The process as set forth in claim 5, further comprising:
forming a plurality of second via holes in a plurality of second copper clad laminates using a drill;
plating an inner wall of each of the second via holes;
exposing and etching plated portions of an upper side and a lower side of each of the second copper clad laminates to form a third circuit pattern on the upper and lower sides of the second copper clad laminates;
layering the second patterned copper clad laminates on each other using an insulating resin adhesive, the insulating resin filling a space between the second copper clad laminates and a portion of the second via holes;
removing the insulating resin adhesive from the second via holes to form third opto-via holes in the second layered copper clad laminates; and
layering the first layered copper clad laminate on the second layered copper clad laminates after the third opto-via holes are formed.

9. A printed circuit board with opto-via holes for optical waveguides, comprising:
a plurality of copper clad laminates with a plurality of via holes formed by a drill;
a plated layer formed on an inner wall of each of the via holes;
a circuit pattern layer formed by exposing and etching plated portions on an upper side and a lower side of each of the copper clad laminates;
an insulating resin adhesive used to layer the patterned copper clad laminates on each other;
a plurality of opto-via holes formed by removing the insulating resin adhesive from the via holes; and
an optical waveguide positioned such that an optical signal through each of the opto-via holes can be obtained.

10. The printed circuit board as set forth in claim 9, wherein the opto-via holes comprise electric-via holes and opto-via holes.

11. The printed circuit board as set forth in claim 9, wherein the opto-via holes are formed by a $CO_2$ laser beam or a mechanical bit.

12. The printed circuit board as set forth in claim 9, wherein an epoxy resin with 95% or more light transmissivity is filled in the opto-via holes.

13. A printed circuit board with opto-via holes for optical waveguides, comprising:
a first copper clad laminate with an insulating layer and copper layers coated on an upper side and a lower side of the insulating layer, said first copper clad laminate including a circuit pattern formed thereon;
an adhesive used to layer copper layers on the first copper clad laminate;
a plurality of electric-via holes formed by drilling the first layered copper clad laminate;
a plurality of first opto-via holes formed at the same time as the drilling of the electric-via holes;
a plated layer formed on an inner wall of each of the electric-via holes and the first opto-via holes;
a first circuit pattern layer formed by exposing and etching the plated portions on an upper side and a lower side of the first layered copper clad laminate;
a plurality of second opto-via holes formed by drilling desired points on the first layered copper clad laminate after the first circuit pattern layer is formed; and
an optical waveguide positioned such that an optical signal can be obtained through each of the first and second opto-via holes.

14. The printed circuit board as set forth in claim 13, wherein an epoxy resin with 95% or more light transmissivity is filled in the second opto-via holes.

15. The printed circuit board as set forth in claim 13, further comprising:

a plurality of second copper clad laminates with a plurality of second via holes formed by a drill;

a second plated layer formed on an inner wall of each of the second via holes;

a second circuit pattern layer formed by exposing and etching plated portions on an upper side and a lower side of each of the second copper clad laminates;

an insulating resin adhesive used to layer the second patterned copper clad laminates on each other; and a plurality of third opto-via holes formed in the second layered copper clad laminates by removing the insulating resin adhesive from the second via holes, the second layered copper clad laminates being layered on the first layered copper clad laminate after the third opto-via holes are formed.

* * * * *